(12) United States Patent
Xie

(10) Patent No.: US 10,078,398 B2
(45) Date of Patent: Sep. 18, 2018

(54) DISPLAY SUBSTRATE, DISPLAY DEVICE AND REMOTE CONTROL SYSTEM

(71) Applicant: BOE Technology Group Co., Ltd., Beijing (CN)

(72) Inventor: Dini Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/105,005

(22) PCT Filed: Sep. 11, 2015

(86) PCT No.: PCT/CN2015/089415
§ 371 (c)(1),
(2) Date: Jun. 16, 2016

(87) PCT Pub. No.: WO2016/173176
PCT Pub. Date: Nov. 3, 2016

(65) Prior Publication Data
US 2017/0139497 A1     May 18, 2017

(30) Foreign Application Priority Data

Apr. 29, 2015   (CN) .......................... 2015 1 0214113

(51) Int. Cl.
*G06F 3/041*     (2006.01)
*G06F 3/042*     (2006.01)
(Continued)

(52) U.S. Cl.
CPC ........ *G06F 3/042* (2013.01); *G02F 1/133514* (2013.01); *G02F 1/136209* (2013.01);
(Continued)

(58) Field of Classification Search
CPC combination set(s) only.
See application file for complete search history.

(56) References Cited

U.S. PATENT DOCUMENTS 8,053,796 B2    11/2011   Wang et al.
8,941,617 B2    1/2015    Koyama et al.
(Continued)

FOREIGN PATENT DOCUMENTS

CN     101409320 A    4/2009
CN     101738781 A    6/2010
(Continued)

OTHER PUBLICATIONS

JP101751188 English translation Lin, Gang Jun. 23, 2010.*
(Continued)

*Primary Examiner* — Van Nguyen Chow
(74) *Attorney, Agent, or Firm* — Westman, Champlin & Koehler, P.A.

(57) ABSTRACT

A display substrate, a display device and a remote control system are provided in order to solve a problem that the existing touch technology is not capable of touching and controlling accurately any region in the display device distant from a user. The display substrate comprises a base substrate, color filters located on the base substrate and at least one optical recognition structure which is located at least partially in non-display regions of the display substrate and is configured to sense an irradiation of a predefined light beam to generate a voltage signal and transmit the voltage signal to an external circuit through a signal line connected to the optical recognition structure.

19 Claims, 6 Drawing Sheets

(51) Int. Cl.
  *G02F 1/1335* (2006.01)
  *G02F 1/1362* (2006.01)
  *G06F 3/0354* (2013.01)
  *G06F 3/038* (2013.01)
  *H01L 27/12* (2006.01)
  *H01L 31/06* (2012.01)
  *H01L 31/12* (2006.01)
  *G06F 3/03* (2006.01)
  *H04N 5/44* (2011.01)

(52) U.S. Cl.
  CPC .......... *G06F 3/0304* (2013.01); *G06F 3/0386* (2013.01); *G06F 3/03542* (2013.01); *H01L 27/1214* (2013.01); *H01L 31/06* (2013.01); *H01L 31/12* (2013.01); *G02F 2001/136222* (2013.01); *H04N 5/4403* (2013.01)

(56) References Cited

U.S. PATENT DOCUMENTS

| | | | | |
|---|---|---|---|---|
| 9,639,205 | B2* | 5/2017 | Kim | ................... G09G 3/3696 |
| 2002/0105603 | A1 | 8/2002 | Yoo | |
| 2004/0061680 | A1 | 4/2004 | Taboada | |
| 2010/0117991 | A1* | 5/2010 | Koyama | ............. G02F 1/13338 |
| | | | | 345/175 |
| 2016/0072968 | A1* | 3/2016 | Nakamura | ......... H04N 1/00241 |
| | | | | 358/1.15 |
| 2016/0275906 | A1* | 9/2016 | Scott | ...................... G09G 5/006 |

FOREIGN PATENT DOCUMENTS

| | | |
|---|---|---|
| CN | 101751188 A | 6/2010 |
| CN | 102902123 A | 1/2013 |
| CN | 102968210 A | 3/2013 |
| CN | 103337538 A | 10/2013 |
| CN | 103713778 A | 4/2014 |
| CN | 104238832 A | 12/2014 |
| CN | 104793813 A | 7/2015 |

OTHER PUBLICATIONS

Second Office Action from Chinese Patent Application No. 201510214113.6, dated Jul. 5, 2017, 20 pages.

International Search Report and Written Opinion for International Application No. PCT/CN2015/089415, dated Jan. 27, 2016, 10 pages.

English translation of Box No. V of the Written Opinion of the International Searching Authority for International Application No. PCT/CN2015/089415, dated Jan. 27, 2016, 2 pages.

First Office Action, including Search Report, for Chinese Patent Application No. 201510214113.6, dated Apr. 19, 2017, 20 pages.

\* cited by examiner

DISPLAY SUBSTRATE, DISPLAY DEVICE AND REMOTE CONTROL SYSTEM

CROSS-REFERENCE TO RELATED APPLICATION

This application is a National Phase Application of PCT/CN2015/089415 filed with International Bureau on Sep. 11, 2015 and claims the benefit of Chinese Patent Application No. 201510214113.6 filed on Apr. 29, 2015 in the State Intellectual Property Office of China, the whole disclosure of which is incorporated herein by reference.

BACKGROUND OF THE INVENTION

Field of the Invention

Embodiments of the present disclosure relate to field of touch display technology, more particularly, relate to a display substrate, a display device and a remote control system.

Description of the Related Art

As a flat-panel liquid crystal display (LCD) develops more and more fast, a flat-panel LCD with touch function has become a main stream of the flat-panel display.

At present, the touch function is typically realized by using a touch display panel. The touch display panel in prior art includes two substrates in association with display function, which are a color filter substrate (CF substrate) and a thin film transistor (TFT) substrate. For this display panel, a real object (for example, a finger, a touch pen, etc.) is required to physically touch a touch panel to perform an operation on the device. A basic principle of this type of touch method in prior art is that a deformation caused by pressing/touching or blocking a surface of the touch panel by the object causes a change in light illumination, capacitance or resistance so as to locate the pressed/touched region and to perform certain control operations by defining different pressing/touching actions (for example, single click, double click or slide) as different operation commands. This type of touch technology in prior art is capable of determining a touch position accurately and recognizing a user's operation so as to make a response. However, this type of touch technology can only be used in a hand-held device close to a person. If the device and the touch panel thereof are distant from a person, for example, a television with a touch screen or touch panel, a hand of the person is not able to touch the panel or screen. In this case, the above type of touch technology is not capable of touching and controlling accurately any region in the display device distant from the user. Moreover, a common remote control device and method needs very complex key operations, and some functions cannot be performed with a key operation. In other words, the existing remote control device and method cannot provide a touch feeling for a user.

SUMMARY OF THE INVENTION

Embodiments of the present disclosure provide a display substrate, a display device and a remote control system in order to solve a problem that the existing touch technology is not capable of touching and controlling accurately any region in the display device distant from a user.

An embodiment of the present disclosure provides a display substrate comprising a base substrate and a color filter layer located on the base substrate. The display substrate further comprises at least one optical recognition structure which covers at least partially non-display regions of the display substrate and is configured to sense an irradiation of a predefined light beam to generate a voltage signal and transmit the voltage signal to an external circuit through a signal line connected to the optical recognition structure.

In the embodiment of the present disclosure, the display substrate comprises a base substrate, color filters, a protective layer and at least one optical recognition structure which is at least partially located in non-display regions of the display substrate. The optical recognition structure is disposed in a non-display region of the display substrate and is configured to sense an irradiation of a predefined light beam to generate a voltage signal and transmit the voltage signal to an external circuit through a signal line connected to the optical recognition structure, so that the external circuit is able to determine a position where the light beam is irradiating according to the voltage signal so as to realize touch and control of any region accurately in the display device distant from a user. Further, an aperture ratio of a pixel may be increased. Moreover, the optical recognition structure is formed on the base substrate, which facilitates to increase transmissivity of light and simplify a structure of the display panel, thereby increasing brightness of the display panel and improving display quality.

According to an exemplary embodiment, the optical recognition structure comprises a solar cell structure located on a side of the base substrate, the solar cell structure comprising:

a negative electrode located on the side of the base substrate;

an N-type semiconductor layer located on a side of the negative electrode facing away from the base substrate;

a P-type semiconductor layer located on a side of the N-type semiconductor layer facing away from the negative electrode; and a positive electrode located on a side of the P-type semiconductor layer facing away from the N-type semiconductor layer.

The solar cell structure is configured to sense an irradiation of a predefined light beam to generate a voltage signal and transmit the voltage signal to an external circuit through a signal line connected to thereto, so that the external circuit is able to determine a position where the light beam is irradiating according to the voltage signal so as to realize touch and control of any region accurately in the display device distant from a user.

According to an exemplary embodiment, the optical recognition structure comprises a solar cell structure located on a side of the base substrate and a thin film transistor located on a side of the solar cell structure facing away from the base substrate, and wherein the thin film transistor has a gate electrode which is also used as a positive electrode of the solar cell structure.

Photo-generated carriers are generated inside the solar cell structure when it is irradiated by a light beam so as to generate a voltage across the solar cell structure. As a result, a voltage signal is generated when the solar cell structure in the optical recognition structure has received an irradiation of the light beam and the voltage signal is supplied to the thin film transistor through the gate electrode so as to control on and off states of the thin film transistor. Further, as each of the electrodes of the thin film transistor is typically formed from opaque metallic material in existing manufacturing process, the optical recognition structure located in the non-display region may function as a black matrix so as to avoid light leakage.

According to an exemplary embodiment, the optical recognition structure comprises:

an N-type semiconductor layer located on a side of the base substrate;

a P-type semiconductor layer located on a side of the N-type semiconductor layer facing away from the base substrate;

a gate electrode located on a side of the P-type semiconductor layer facing away from the N-type semiconductor layer;

a gate insulation layer located on a side of the gate electrode facing away from the P-type semiconductor layer; and a source electrode, a drain electrode and an active layer located on a side of the gate insulation layer facing away from the gate electrode, and wherein the source electrode is electrically connected with the gate electrode.

In the optical recognition structure, since the source electrode is electrically connected with the gate electrode, the thin film transistor will be turned on if the voltage of the voltage signal generated in the solar cell structure is larger than a threshold voltage of the thin film transistor, and the voltage signal generated in the optical recognition structure will be transmitted to an external circuit through a signal line connected with the optical recognition structure so that the external circuit is able to determine a position where the light beam is irradiating according to the voltage signal.

According to an exemplary embodiment, the color filter layer comprises a plurality of color filters arranged regularly, and the optical recognition structure is disposed in non-display regions other than regions where the color filter are disposed.

By disposing the optical recognition structure between adjacent color filters, the optical recognition accuracy may be increased and reach a pixel level. Moreover, by disposing the optical recognition structure between adjacent color filters and setting the optical recognition structure as an opaque structure, a crosstalk of light between adjacent pixel units may be prevented, that is, the optical recognition structure functions as a black matrix, thus no black matrix is required to be disposed in the display substrate, thereby simplifying the structure of the display substrate further.

According to an exemplary embodiment, each of the optical recognition structures is arranged to correspond to one color filter.

By providing a corresponding optical recognition structure for each color filter in the pixel unit, the accuracy of the optical recognition may be increased, specifically, the accuracy of the optical recognition may reach the pixel level, so as to realize touch and control of any region accurately in the display device distant from a user.

According to an exemplary embodiment, the optical recognition structure presents an L-shape to form a half-surrounding structure for the color filter.

In a case that the optical recognition structure presents an L-shape which forms a half-surrounding structure for the color filter, the optical recognition structure may be used to replace the black matrix, so that a crosstalk of light between different pixel units may be prevented and the structure of the display substrate may be further simplified.

Another embodiment of the present disclosure provides a display device comprising a display substrate according to any one of the above embodiments.

Further, the display device further comprises a coordinate register and an information processing circuit located in a peripheral circuit region of the display device, and wherein the coordinate register stores coordinates of each of the optical recognition structure therein for determining coordinate information of a position where light beam is irradiating according to a voltage signal output by the optical recognition structure and outputting the coordinate information to the information processing circuit, and the information processing circuit is configured for determining a user's operation command according to the coordinate information output by the coordinate register to perform a corresponding operation and for outputting a display signal to drive the display device to display.

In the display device, the optical recognition structure generates a voltage signal upon receiving an irradiation of a predefined light beam and transmits the voltage signal to the coordinate register through a signal line. Since the coordinate register stores the coordinate of each of the optical recognition structures therein, the coordinate register is capable of determining coordinate information of a position where light beam is irradiating according to the voltage signal output by the optical recognition structure and outputting the coordinate information to the information processing circuit. The information processing circuit is capable of determining a user's operation command according to the coordinate information output by the coordinate register to perform a corresponding operation and outputting a display signal to drive the display device to display. As a result, an accurate touch and control in any region in the display device distant from a user can be realized.

A further embodiment of the present disclosure provides a remote control system comprising a display device according to any one of the above embodiments and a remote control terminal for emitting a predefined light beam to the display device so as to send an operation command to the display device.

In the remote control system, the remote control terminal sends a predefined light beam to the display device, and the optical recognition structure in the display device generates a voltage signal upon receiving an irradiation of the predefined light beam and transmits the voltage signal to the coordinate register through a signal line. As the coordinate register stores the coordinate of each of the optical recognition structures therein, the coordinate register is capable of determining coordinate information of a position where light beam is irradiating according to the voltage signal output by the optical recognition structure and outputting the coordinate information to the information processing circuit. The information processing circuit is capable of determining a user's operation command according to the coordinate information output by the coordinate register to perform a corresponding operation and outputting a display signal to drive the display device to display. As a result, an accurate touch and control in any region in the display device distant from a user can be realized.

According to an exemplary embodiment, the remote control terminal comprises a position laser for positioning and an operation laser for performing an operation, and wherein a laser spot from the position laser coincides with that from the operation laser, and a light wave frequency of the position laser is lower than that of the operation laser.

During an operation by using the remote control terminal, the position laser is turned on for a long time, so the user can determine a position of a current laser spot according to the laser spot of the position laser so as to perform various operation actions by using the operation laser. Further, as the light wave frequency of the position laser is lower than that of the operation laser, the light beam emitted from the position laser is not high enough to enable the optical recognition structure to generate a voltage signal, that is, only the light beam emitted from the operation laser can enable the optical recognition structure to generate a voltage signal to be supplied to the external circuit. Thus, in a case that the light wave frequency of the position laser is lower than that of the operation laser, the light beam emitted from the position laser may be prevented from affecting the operation accuracy so as to avoid any misoperation.

DETAILED DESCRIPTION OF PREFERRED EMBODIMENTS OF THE INVENTION

Embodiments of the present disclosure provide a display substrate, a display device and a remote control system in order to solve a problem that the existing touch technology is not capable of touching and controlling accurately any region in the display device distant from a user.

Technical solutions in the embodiments of the present disclosure will be described clearly and completely as below in conjunction with the accompanying drawings of embodiments of the present disclosure. It is to be understood that the described embodiments are only a part of but not all of exemplary embodiments of the present disclosure. Based on the described embodiments of the present disclosure, various other embodiments can be obtained by those skilled in the art without creative labor and those embodiments shall fall into the protection scope of the present invention.

Figure 1:
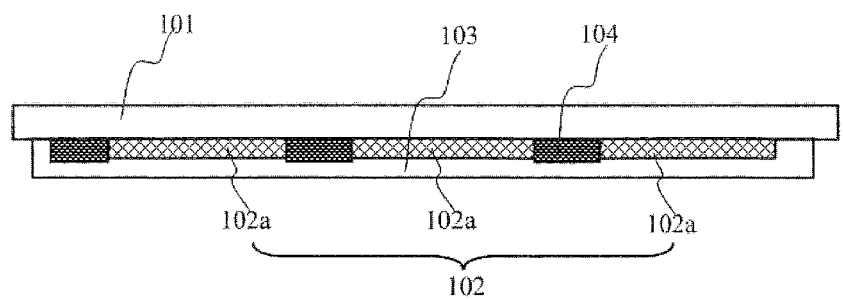
FIG. 1 is a schematic structural sectional view of a display substrate according to an embodiment of the present disclosure.
Figure 2:
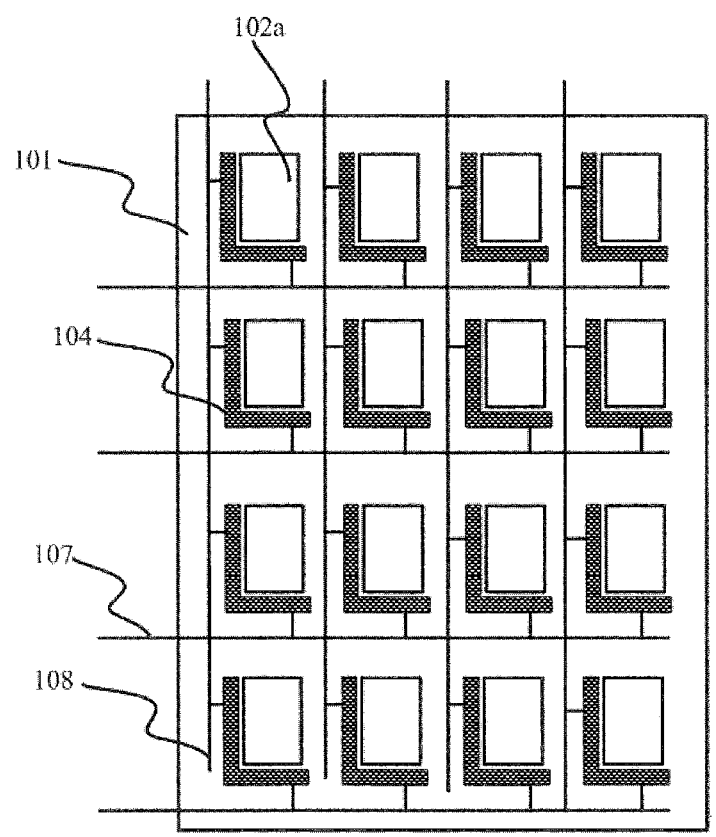
FIG. 2 is a schematic structural plan view of a display substrate according to an embodiment of the present disclosure.

An embodiment of the present disclosure provides a display substrate, as shown in FIGS. 1 and 2. Referring to FIGS. 1 and 2, the display substrate comprises a base substrate 101 and a color filter layer 102 located on the base substrate. Further, the display substrate comprises at least one optical recognition structure 104 which covers at least partially non-display regions of the display substrate and is configured to sense an irradiation of a predefined light beam to generate a voltage signal and transmit the voltage signal to an external circuit through a signal line connected to the optical recognition structure.

Further, the display substrate comprises a protective layer 103 which is located on the color filter layer 102 to protect a structure of the color filter layer 102 from being damaged.

In the display substrate according to the embodiment of the present disclosure, the optical recognition structure is disposed in a non-display region of the display substrate and is configured to sense an irradiation of a predefined light beam to generate a voltage signal and transmit the voltage signal to an external circuit through a signal line connected to the optical recognition structure, so that the external circuit is able to determine a position where the light beam is irradiating according to the voltage signal so as to realize touch and control of any region accurately in the display device distant from a user. Further, an aperture ratio of a pixel may be increased. Moreover, the optical recognition structure is formed on the base substrate, which facilitates increasing transmissivity of light and simplifying a structure of the display panel, thereby increasing brightness of the display panel and improving display quality.

According to an embodiment, the optical recognition structure is configured not to generate voltage signal when a light beam from a first light source is irradiating on it and to generate a voltage signal when a light beam from a second light source is irradiating on it. As an example, the first light source may emit visible light and the second light source may emit invisible light having a higher frequency than the visible light.

According to an embodiment, the optical recognition structure is an opaque structure to replace a black matrix so as to simplify the structure of the display panel.

Figure 3A:
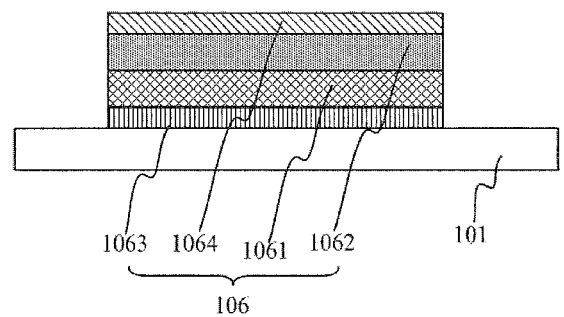
FIG. 3*a* is a schematic structural sectional view along an optical recognition structure according to an embodiment of the present disclosure.

Further, as shown in FIG. 3*a*, the optical recognition structure 104 may comprise a solar cell structure 106 located on a side of the base substrate. The solar cell structure 106 may comprise:

a negative electrode 1063 located on a side of the base substrate 101;

an N-type semiconductor layer 1061 located on a side of the negative electrode facing away from the base substrate 101;

a P-type semiconductor layer 1062 located on a side of the N-type semiconductor layer 1061 facing away from the negative electrode; and a positive electrode 1064 located on a side of the P-type semiconductor layer 1062 facing away from the N-type semiconductor layer.

Further, the negative electrode 1063 is connected with an external circuit through a lateral signal line (gate line) 107 on the base substrate 101, and the positive electrode 1064 is connected with the external circuit through a longitudinal signal line (data line) 108 on the base substrate 101.

Further, the solar cell structure is prepared from material having a large energy gap so that no voltage signal is generated when visible light is irradiating on the solar cell structure and a voltage signal is generated only when invisible light having a higher frequency than the visible light is irradiating on the solar cell structure, thereby prevent the visible light from affecting adversely accuracy of the remote control.

Figure 3B:
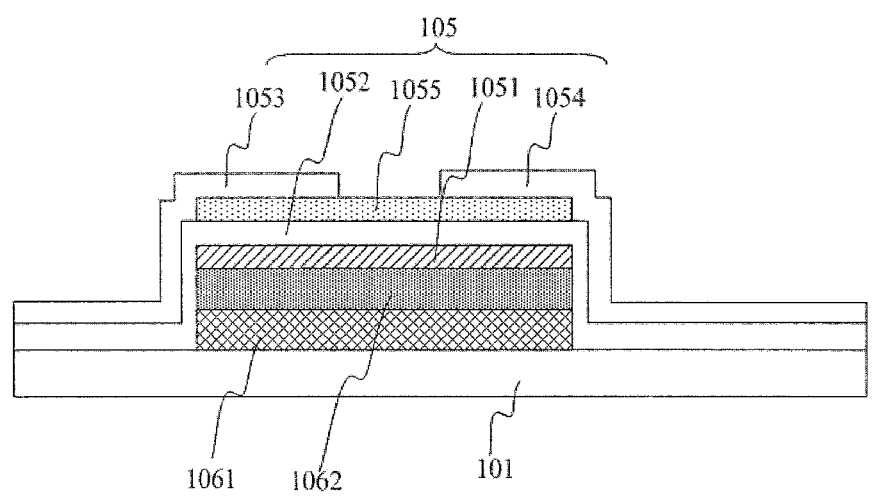
FIG. 3*b* is a schematic structural sectional view along an optical recognition structure according to an embodiment of the present disclosure.

Further, as shown in FIG. 3*b*, the optical recognition structure 104 may comprise a solar cell structure 106 located on a side of the base substrate 101 and a thin film transistor (TFT) 105 located on a side of the solar cell structure 106 facing away from the base substrate. The thin film transistor 105 has a gate electrode 1051 which is also used as the positive electrode of the solar cell structure 106.

Photo-generated carriers are generated inside the solar cell structure when it has received an irradiation of the light beam so as to generate a voltage across the solar cell structure. As a result, a voltage signal is generated when the solar cell structure in the optical recognition structure has received an irradiation of the light beam and the voltage signal is supplied to the thin film transistor through the gate electrode so as to control on and off states of the thin film transistor. Further, as each of the electrodes of the thin film transistor is formed from opaque metallic material, the optical recognition structure located in the non-display region may function as a black matrix so as to avoid light leakage.

Specifically, the optical recognition structure 104 may comprise:

an N-type semiconductor layer 1061 located on a side of the base substrate;

a P-type semiconductor layer 1062 located on a side of the N-type semiconductor layer 1061 facing away from the base substrate;

a gate electrode 1051 located on a side of the P-type semiconductor layer 1062 facing away from the N-type semiconductor layer 1061;

a gate insulation layer 1052 located on a side of the gate electrode 1051 facing away from the P-type semiconductor layer 1062;

a source electrode 1053, a drain electrode 1054 and an active layer 1055 located on a side of the gate insulation layer 1052 facing away from the gate electrode 1051; wherein the source electrode 1053 is electrically connected with the gate electrode 1051.

In the embodiment, the source electrode and the drain electrode are formed on a side of the active layer 1055 facing away from the solar cell structure by means of depositing. Moreover, the source electrode 1053 and the drain electrode 1054 are formed at two opposite sides of the active layer 1055 by means of ion implantation.

In the optical recognition structure, the P-type semiconductor layer and the N-type semiconductor layer are formed into a solar cell structure. When a light beam of a certain wavelength is irradiating on the N-type semiconductor layer, a voltage signal will be generated on the gate electrode which is used as a positive electrode of the solar cell structure. As the source electrode is electrically connected with the gate electrode, the thin film transistor will be turned on if the voltage of the voltage signal generated in the solar cell structure is larger than a threshold voltage of the thin film transistor, and the voltage signal generated in the optical recognition structure will be transmitted to an external circuit through a signal line connected with the optical recognition structure so that the external circuit is able to determine a position where the light beam is irradiating according to the voltage signal.

Figure 4:
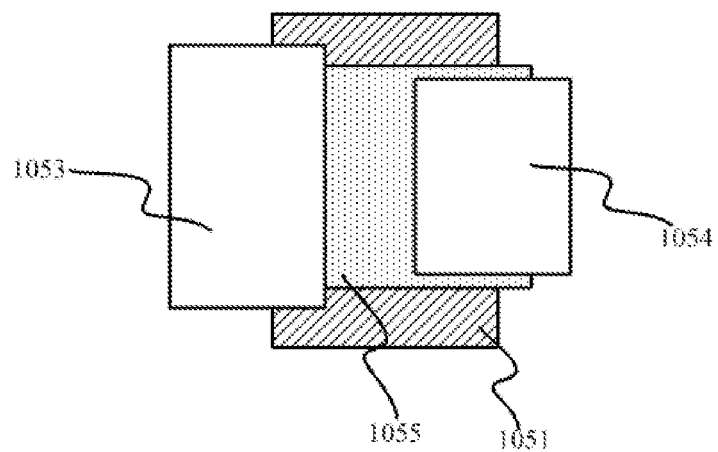
FIG. 4 is a schematic structural plan view of a thin film transistor in an optical recognition structure according to an embodiment of the present disclosure.

Further, it can be seen from FIG. 4 that a width of the source electrode 1053 is larger than a width of the active layer 1055 so that the source electrode 1053 is directly connected with the gate electrode 1051. When the solar cell structure receives an irradiation of a predefined light beam, the voltage signal generated in the gate electrode may be directly transmitted to the source electrode 1053 so that the thin film transistor is turned on and the voltage signal is allowed to be transmitted to the external circuit.

Further, as shown in FIG. 2, the color filter layer 102 may comprise a plurality of color filters 102a arranged regularly, and the optical recognition structure 104 is disposed between adjacent color filters 102a.

Further, the source electrode 1053 is connected with the external circuit through a lateral signal line (gate line) 107 on the base substrate 101, and the drain electrode 1054 is connected with the external circuit through a longitudinal signal line (data line) 108 on the base substrate 101.

By disposing the optical recognition structure between adjacent color filters, an accuracy of the optical recognition may reach pixel level, which facilitates increasing the accuracy of the optical recognition. Moreover, by disposing the optical recognition structure between adjacent color filters, a crosstalk of light between two adjacent pixel units may be prevented, that is, the optical recognition structure functions as a black matrix, thus no black matrix is required to be disposed in the display substrate, thereby simplifying the structure of the display substrate further.

Further, each of the optical recognition structures 104 corresponds to the color filter in each one of the pixel units.

By disposing one corresponding color filter in the pixel unit for each of the optical recognition structures, the accuracy of the optical recognition is increased, specifically, the accuracy of the optical recognition may reach the pixel level, so as to realize touch and control of any region accurately in the display device distant from a user.

Further, as shown in FIG. 2, the optical recognition structure presents an L-shape which forms a half-surrounded structure for the color filter.

In a case that the optical recognition structure presents an L-shape which forms a half-surrounding structure for the color filter, the optical recognition structure may be used to replace the black matrix, so that a crosstalk of light between different pixel units may be prevented and the structure of the display substrate may be further simplified.

Another embodiment of the present disclosure provides a display device comprising the display substrate according to any one of the above embodiments.

Figure 5:
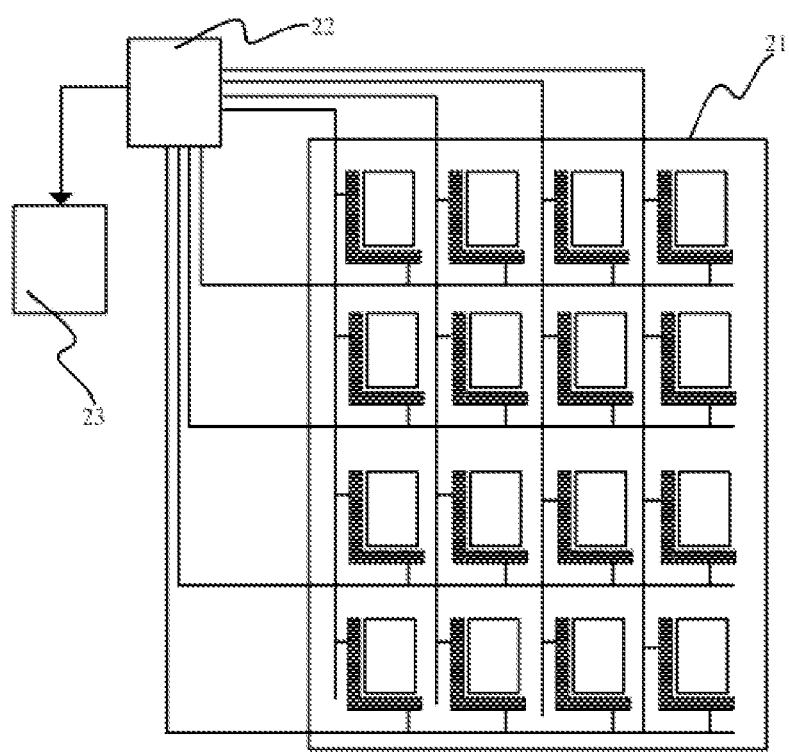
FIG. 5 is a schematic structural view of a display device according to an embodiment of the present disclosure.

Further, as shown in FIG. 5, the display device further comprises a coordinate register 22 and an information processing circuit 23 located in a peripheral circuit region of the display device. The coordinate register 22 stores coordinates of each of the optical recognition structure therein for determining coordinate information of a position where light beam is irradiating according to a voltage signal output by the optical recognition structure and outputting the coordinate information to the information processing circuit, and the information processing circuit 23 is configured for determining a user's operation command according to the coordinate information output by the coordinate register to perform a corresponding operation and for outputting a display signal to drive the display device to display.

In the display device, the optical recognition structure generates a voltage signal upon receiving an irradiation of a predefined light beam and transmits the voltage signal to the coordinate register through a signal line. As the coordinate register stores the coordinate of each of the optical recognition structures therein, the coordinate register is capable of determining coordinate information of a position where light beam is irradiating according to the voltage signal output by the optical recognition structure and outputting the coordinate information to the information processing circuit. The information processing circuit is capable of determining a user's operation command according to the coordinate information output by the coordinate register to perform a corresponding operation and outputting a display signal to drive the display device to display. As a result, an accurate touch and control in any region in the display device distant from a user can be realized.

A further embodiment of the present disclosure provides a remote control system comprising the display device according to any one of the above embodiments and a remote control terminal for emitting a predefined light beam to the display device so as to send an operation command to the display device.

In the remote control system, the remote control terminal sends a predefined light beam to the display device, and the optical recognition structure in the display device generates a voltage signal upon receiving an irradiation of the predefined light beam and transmits the voltage signal to the coordinate register through a signal line. As the coordinate register stores the coordinate of each of the optical recognition structures therein, the coordinate register is capable of determining coordinate information of a position where light beam is irradiating according to the voltage signal output by the optical recognition structure and outputting the coordinate information to the information processing circuit. The information processing circuit is capable of determining a user's operation command according to the coordinate information output by the coordinate register to perform a corresponding operation and outputting a display signal to drive the display device to display. As a result, an accurate touch and control in any region in the display device distant from a user can be realized.

Further, the remote control terminal comprises a position laser for positioning and an operation laser for performing an operation. A laser spot from the position laser coincides with that from the operation laser, and a light wave frequency of the position laser is lower than that of the operation laser, so that no voltage signal is generated when the light beam from the position laser is irradiating on the optical recognition structure and the optical recognition structure generates a voltage signal when the light beam from the operation laser is irradiating on the optical recognition structure.

According to an embodiment, the position laser emits visible light and the operation laser emits invisible light.

In general, the position laser may emit red or green light having low light wave frequency to facilitate recognizing a position where the light beam is irradiating on the screen by the user. The operation laser may emit blue light having high light wave frequency or invisible light such as ultraviolet light having higher light wave frequency. Since the light wave frequency of the light beam in the operation laser is higher, excitation energy generated when photon transition occurs is larger. Correspondingly, the solar cell is designed to be excited only by the blue light having high light wave frequency or the invisible light having higher light wave frequency, so as to realize an accurate remote touch and control.

During an operation by using the remote control terminal, as the position laser is turned on for a long time, the user can determine a position of a current laser spot according to the laser spot of the position laser so as to perform various operation actions by using the operation laser. Further, as the light wave frequency of the position laser is lower than that of the operation laser, the light beam emitted from the position laser is not high enough to enable the optical recognition structure to generate a voltage signal, that is, only the light beam emitted from the operation laser can enable the optical recognition structure to generate a voltage signal and supply it to the external circuit. Thus, in a case that the light wave frequency of the position laser is lower than that of the operation laser, the light beam emitted from the position laser may be prevented from affecting the operation accuracy so as to avoid any misoperation.

On a basis of the same inventive concept, an embodiment of the present disclosure further provides a remote control method comprising:

determining information of a position where light beam is received when the display device receives a predefined light beam which is emitted from a remote control terminal towards any region of a display panel;

performing a corresponding operation according to an operation command when the display device receives the operation command sent by the remote control terminal.

Specifically, the step of determining information of a position where light beam is received when the display device receives a predefined light beam which is emitted from a remote control terminal towards any region of a display panel comprises:

the optical recognition structure generating a voltage signal and transmitting the voltage signal to a coordinate register through a signal line when the optical recognition structure receives the predefined light beam emitted from the remote control terminal;

the coordinate register determining a coordinate corresponding to the optical recognition structure which generates the voltage signal according to the voltage signal and the coordinate of each of the optical recognition structures stored in the coordinate register.

Specifically, the step of performing a corresponding operation according to an operation command when the display device receives the operation command sent by the remote control terminal comprises:

determining a user's operation command by an information processing circuit according to the coordinate information output by the coordinate register to perform a corresponding operation, and outputting a display signal to drive the display device to display.

Further, the operation command includes any operation command similar to an operation command which can be generated on a touch panel terminal, for example, one click in an active region, double click in an active region, long press in an active region, slide operation from an active region in various directions and the like. The display device performs corresponding operations according to the above operation commands, for example, to open a corresponding application when double clicking an icon, to flip pages when sliding from right to left, to enlarge a region covered by a slide when sliding from bottom to top, or the like.

Figure 6:
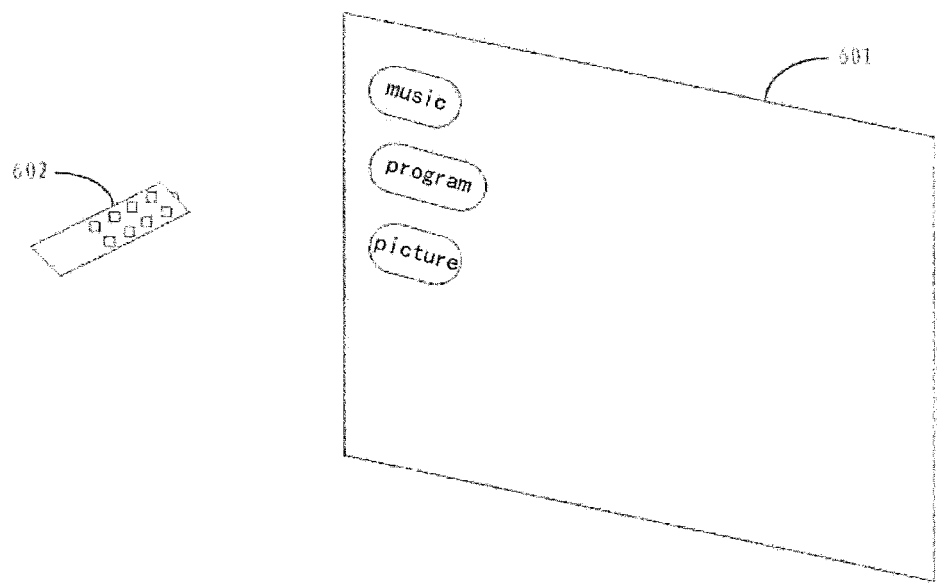
FIGS. 6 to 11 are schematic views of an operation flowchart of a remote control system according to an embodiment of the present disclosure.

The remote control method according to the present disclosure will be explained in the following particular embodiment. As shown in FIG. 6, a large screen television 601 installed with a smart operation system has an optical recognition structure, a corresponding remote controller 602 sends a predefined light beam which can be received and recognized by a photosensitive sensor of the television, and the remote controller is connected with the television through wireless technology (similar to a connection between a computer and a mouse), the remote controller sends an operation command to the television through this connection.

Figure 7:
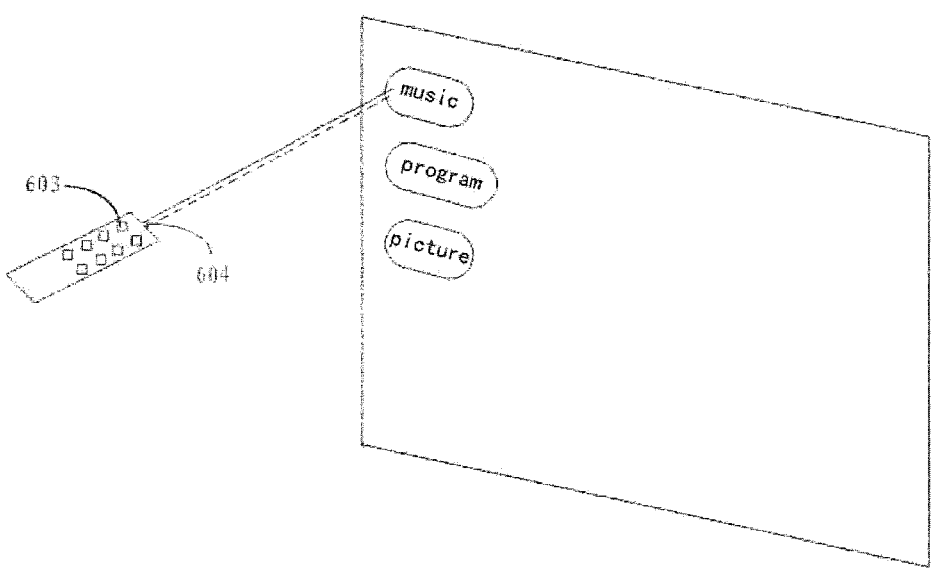
Figure 8:
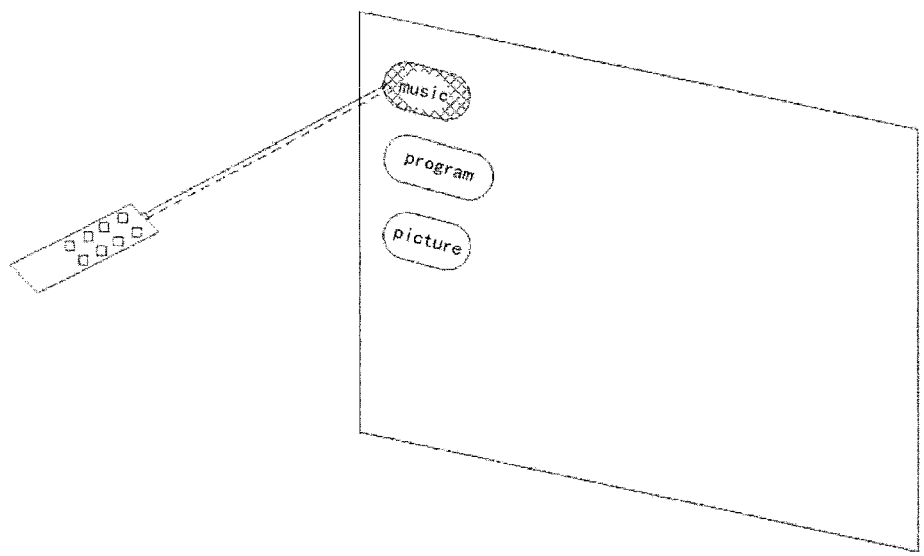
Figure 9:
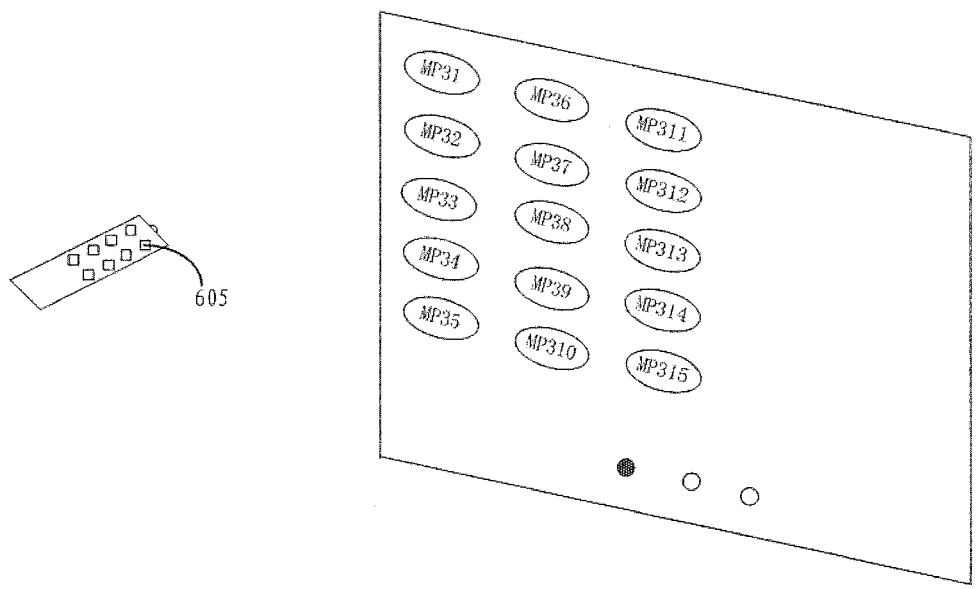
Figure 10:
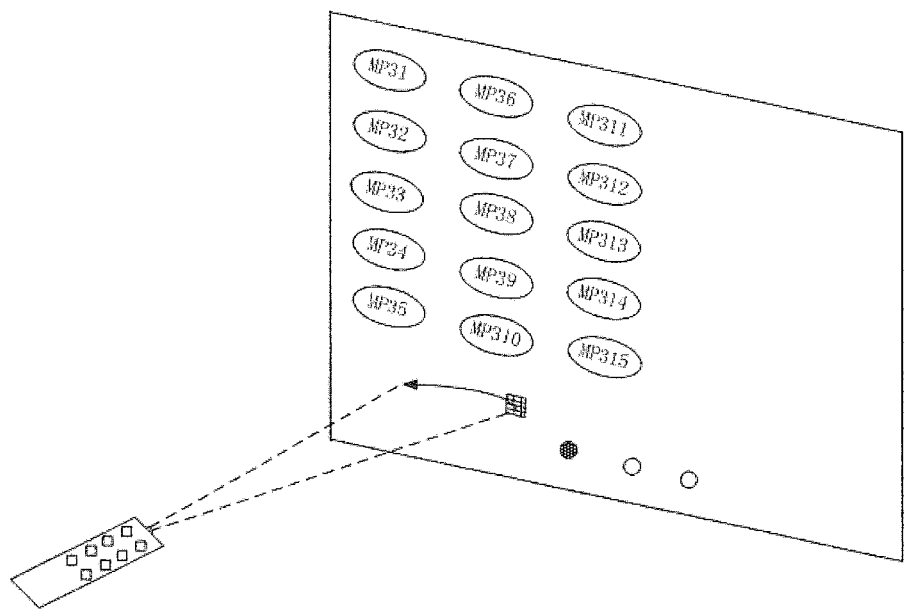
Figure 11:
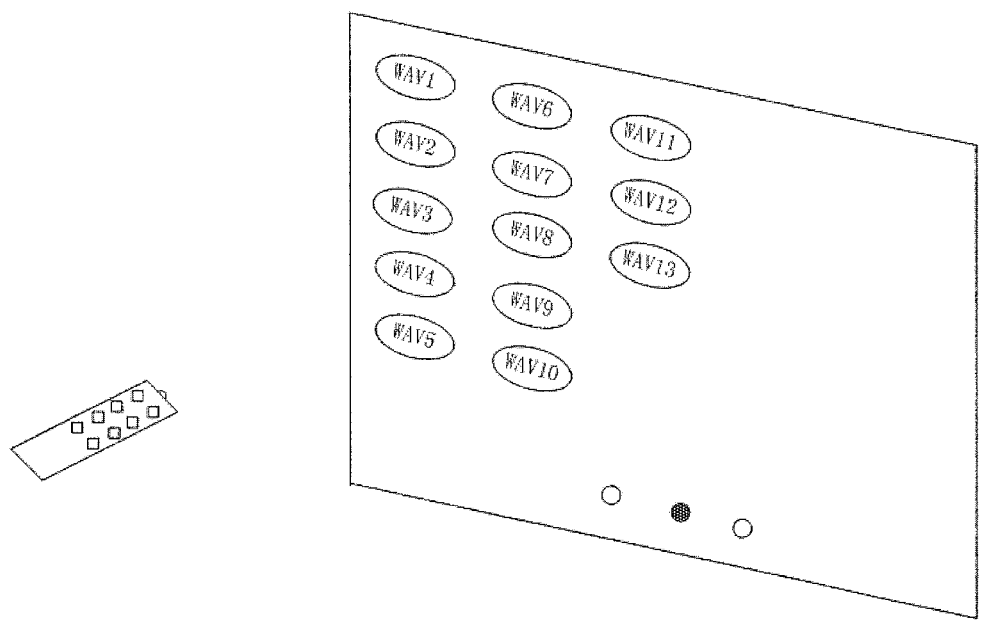

A method of remotely optically controlling the television by the remote controller may comprise steps of:

step S1. turning on the television so that various icons such as "television program", "music", "picture" or the like are displayed on the screen, as shown in FIG. 6;

step S2. turning on a switch 603 of a light emitter of the remote controller so that a position laser and an operation laser in a top emitter 604 of the remote controller emit red visible light (as indicated by solid line) and invisible light (as indicated by dotted line) having high frequency respectively to irradiate on the television screen, as shown in FIG. 7;

step S3. generating a voltage signal when an optical recognition structure inside the television which is irradiated by the light receives the invisible light and transmitting the voltage signal to an information processing circuit of the television through signal lines (along X and Y axes), and showing a position on the television screen at which the remote controller is directing for the user by using a laser spot emitted by the position laser. For example, when a light beam is irradiating on the "music" icon, the coordinate where the "music" icon is located is transmitted to the information processing circuit of the television, and then the information processing circuit determines that the "music" icon is activated, as shown in FIG. 8;

step S4. clicking an operation confirming key 605 by the user, that is, performing a clicking operation (corresponding to clicking a left key of mouse or touching a screen of smart phone by a user's finger) on the "music" icon so as to enter music library, the music library containing a plurality of song icons which are displayed in a plurality of pages (displayed in first, second and third pages from left to right, one page displayed each time), as shown in FIG. 9;

step S5. pressing and holding the operation confirming key 605 by the user so that the invisible light emitted from the operation laser of the remote controller to the television screen slides on the screen from right to left, as shown in FIG. 10. In this case, the currently displayed image (for example, the first page) on the screen is moved from right to left until it disappears and then the second page is displayed on the screen, which is similar to sliding the smart phone by a finger, as shown in FIG. 11.

In summary, embodiments of the present disclosure provide a display substrate, a display device and a remote control system. The display substrate comprises at least one optical recognition structure which is at least partially disposed in a non-display region of the display substrate and is configured to sense an irradiation of a predefined light beam to generate a voltage signal and transmit the voltage signal to an external circuit through a signal line connected to the optical recognition structure, so that the external circuit is able to determine a position where the light beam is irradiating according to the voltage signal so as to realize touch and control of any region accurately in the display device distant from a user. Further, an aperture ratio of a pixel may be increased. Moreover, the optical recognition structure is formed on the base substrate, which facilitates increasing transmissivity of light and simplifying a structure of the display panel, thereby increasing brightness of the display panel and improving display quality.

It is obvious for those skilled in the art that various changes and modifications can be made without departing from the spirit and scope of the present invention. Thus, the present invention intends to contain these changes and modifications if these changes and modifications fall within a scope defined by claims of the present invention and equivalents thereof.

What is claimed is:

1. A display substrate, comprising at least one optical recognition structure,
wherein the at least one optical recognition structure is at least partially disposed in a non-display region of the display substrate and is configured to sense an irradiation of a predefined light beam to generate a voltage signal and transmit the voltage signal to an external circuit through a signal line connected to the optical recognition structure,
wherein the display substrate comprises a base substrate and a color filter layer located on the base substrate,
the color filter layer comprises a plurality of color filters arranged regularly, and
the optical recognition structure is disposed in a region on the base substrate other than regions where the color filters are disposed, the optical recognition structure is disposed between any two adjacent color filters and next to the color filters.

2. The display substrate according to claim 1, wherein the optical recognition structure comprises a solar cell structure located on a side of the base substrate, the solar cell structure comprising:
a negative electrode located on the side of the base substrate;
an N-type semiconductor layer located on a side of the negative electrode facing away from the base substrate;
a P-type semiconductor layer located on a side of the N-type semiconductor layer facing away from the negative electrode; and
a positive electrode located on a side of the P-type semiconductor layer facing away from the N-type semiconductor layer.

3. The display substrate according to claim 2, wherein the negative electrode is connected with the external circuit through a first signal line on the base substrate, and the positive electrode is connected with the external circuit through a second signal line on the base substrate.

4. The display substrate according to claim 1, wherein the optical recognition structure comprises:
a solar cell structure located on a side of the base substrate and a thin film transistor located on a side of the solar cell structure facing away from the base substrate, wherein the thin film transistor has a gate electrode which is also used as a positive electrode of the solar cell structure.

5. The display substrate according to claim 4, wherein the optical recognition structure comprises:
an N-type semiconductor layer located on the side of the base substrate;
a P-type semiconductor layer located on a side of the N-type semiconductor layer facing away from the base substrate;
a gate electrode located on a side of the P-type semiconductor layer facing away from the N-type semiconductor layer;
a gate insulation layer located on a side of the gate electrode facing away from the P-type semiconductor layer; and
a source electrode, a drain electrode and an active layer located on a side of the gate insulation layer facing away from the gate electrode, and
wherein the source electrode is electrically connected with the gate electrode.

6. The display substrate according to claim 5, wherein the source electrode is connected with the external circuit through a first signal line on the base substrate, and the drain electrode is connected with the external circuit through a second signal line on the base substrate.

7. The display substrate according to claim 1, wherein the optical recognition structure is configured to not generate any voltage signal when a light beam from a first light source is irradiating on it and to generate a voltage signal when a light beam from a second light source is irradiating on it.

8. The display substrate according to claim 1, wherein the optical recognition structure is an opaque structure to replace a black matrix.

9. The display substrate according to claim 1, wherein each optical recognition structure is arranged to correspond to one color filter.

10. The display substrate according to claim 9, wherein the optical recognition structure presents an L-shape to form a half-surrounding structure for the color filter.

11. A display device comprising the display substrate according to claim 1.

12. The display device according to claim 11, wherein the display device further comprises a coordinate register and an information processing circuit located in a peripheral circuit region of the display device, and wherein the coordinate register stores coordinates of each optical recognition structure therein for determining coordinate information of a position where light beam is irradiating according to a voltage signal output by the optical recognition structure and outputting the coordinate information to the information processing circuit, and the information processing circuit is configured for determining a user's operation command according to the coordinate information output by the coordinate register to perform a corresponding operation and for outputting a display signal to drive the display device to display.

13. A remote control system, comprising the display device according to claim 11 and a remote control terminal for emitting a predefined light beam to the display device so as to send an operation command to the display device.

14. The remote control system according to claim 13, wherein the remote control terminal comprises a position laser for positioning and an operation laser for performing an operation, and wherein a laser spot from the position laser coincides with that from the operation laser, and a light wave frequency of the position laser is lower than that of the operation laser, so that no voltage signal is generated when the light beam from the position laser is irradiating on the optical recognition structure and a voltage signal is generated when the light beam from the operation laser is irradiating on the optical recognition structure.

15. The remote control system according to claim 14, wherein the position laser emits visible light and the operation laser emits invisible light.

16. The remote control system according to claim 14, wherein the position laser emits red or green light and the operation laser emits blue or ultraviolet light.

17. A remote control system, comprising the display device according to claim 12 and a remote control terminal for emitting a predefined light beam to the display device so as to send an operation command to the display device.

18. The remote control system according to claim 17, wherein the remote control terminal comprises a position laser for positioning and an operation laser for performing an operation, and wherein a laser spot from the position laser coincides with that from the operation laser, and a light wave frequency of the position laser is lower than that of the operation laser, so that no voltage signal is generated when the light beam from the position laser is irradiating on the optical recognition structure and a voltage signal is generated when the light beam from the operation laser is irradiating on the optical recognition structure.

19. The remote control system according to claim 18, wherein the position laser emits visible light and the operation laser emits invisible light.

* * * * *